United States Patent
Werner et al.

(10) Patent No.: US 9,406,551 B2
(45) Date of Patent: Aug. 2, 2016

(54) METHOD FOR MANUFACTURING A SEMICONDUCTOR SUBSTRATE, AND METHOD FOR MANUFACTURING SEMICONDUCTOR DEVICES INTEGRATED IN A SEMICONDUCTOR SUBSTRATE

(71) Applicant: Infineon Technologies Austria AG, Villach (AT)

(72) Inventors: Wolfgang Werner, Munich (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 654 days.

(21) Appl. No.: 13/628,301

(22) Filed: Sep. 27, 2012

(65) Prior Publication Data
US 2014/0087541 A1   Mar. 27, 2014

(51) Int. Cl.
*H01L 21/304* (2006.01)
*H01L 21/762* (2006.01)
*H01L 21/02* (2006.01)
*H01L 21/78* (2006.01)

(52) U.S. Cl.
CPC .... *H01L 21/76259* (2013.01); *H01L 21/02005* (2013.01); *H01L 21/304* (2013.01); *H01L 21/76251* (2013.01); *H01L 21/7806* (2013.01)

(58) Field of Classification Search
None
See application file for complete search history.

(56) References Cited

U.S. PATENT DOCUMENTS

| 6,303,405 | B1 | 10/2001 | Yoshida et al. |
| 2004/0142542 | A1 | 7/2004 | Murphy et al. |
| 2006/0063352 | A1 | 3/2006 | Barlocchi et al. |
| 2009/0117707 | A1* | 5/2009 | Shimomura ...... H01L 21/76254 438/458 |
| 2012/0080686 | A1 | 4/2012 | Mauder et al. |

FOREIGN PATENT DOCUMENTS

CN   1716577 A   1/2006

* cited by examiner

*Primary Examiner* — Seahvosh Nikmanesh
(74) *Attorney, Agent, or Firm* — Murphy, Bilak & Homiller, PLLC

(57) ABSTRACT

A method of manufacturing a semiconductor substrate includes providing a semiconductor wafer having a first surface and a second surface opposite the first surface, and forming, when seen in a cross-section perpendicular to the first surface, cavities in the semiconductor wafer at a first distance from the first surface. The cavities are laterally spaced from each other by partition walls formed by semiconductor material of the wafer. The cavities form a separation region. The method further includes forming a semiconductor layer on the first surface of the semiconductor wafer, and breaking at least some of the partition walls by applying mechanical impact to the partition walls to split the semiconductor wafer along the separation region.

22 Claims, 10 Drawing Sheets

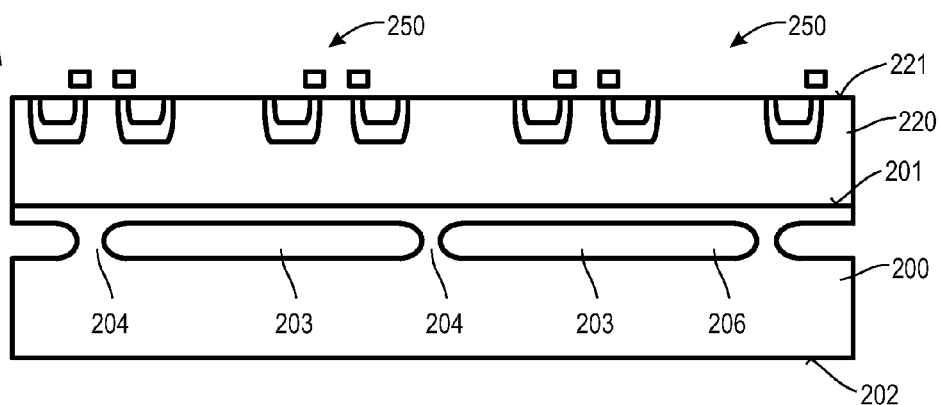
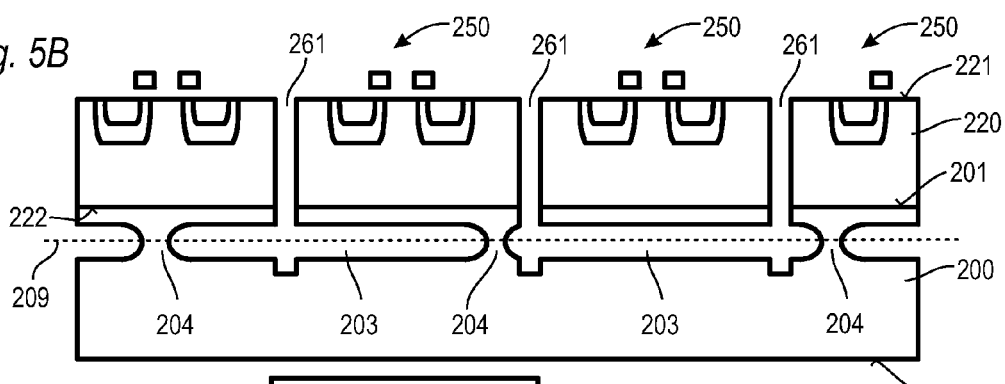
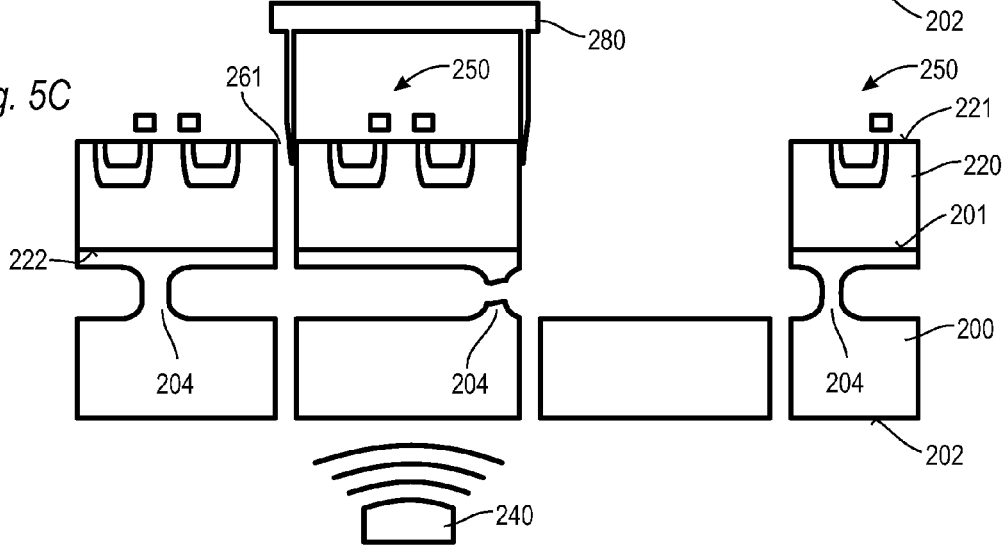
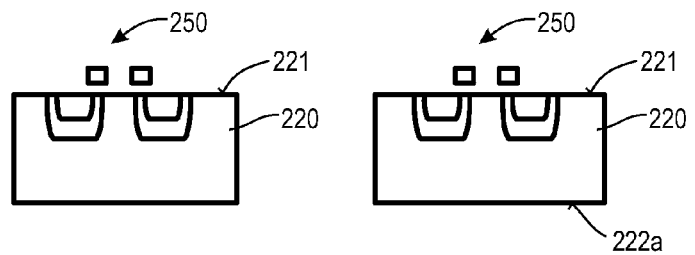

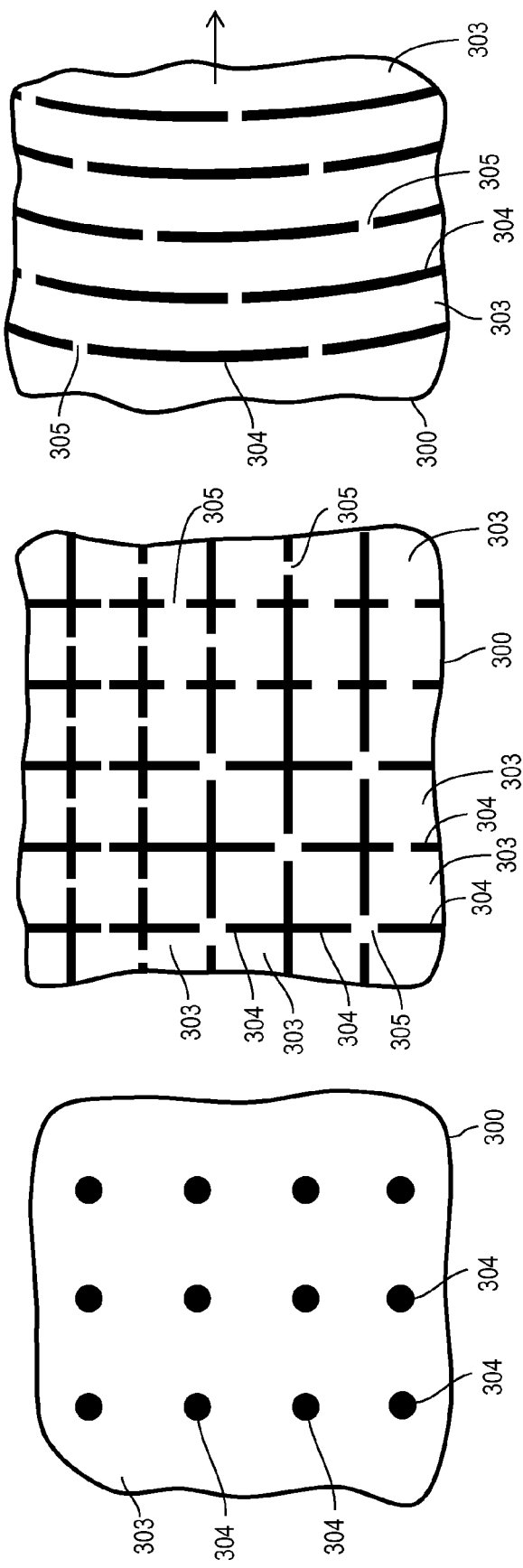

METHOD FOR MANUFACTURING A SEMICONDUCTOR SUBSTRATE, AND METHOD FOR MANUFACTURING SEMICONDUCTOR DEVICES INTEGRATED IN A SEMICONDUCTOR SUBSTRATE

TECHNICAL FIELD

Embodiments described herein relate to methods for manufacturing a semiconductor substrate and methods for manufacturing semiconductor devices integrated in a semiconductor substrate.

BACKGROUND

For integrated devices, particularly power devices, suitably adapted semiconductor substrates are needed. Power devices, for example vertical power devices, need semiconductor substrates with a minimal thickness to withstand the rated blocking voltage. The minimal thickness may be, for example 60 µm. On the other hand, during processing of the semiconductor substrate, a higher thickness, for example 600 µm, is desired for mechanical stability. Thick substrates, however, have a high electrical and thermal resistance which may affect the electrical performance of the final devices. After integrating the devices, the substrates are therefore thinned to reduce these resistances.

For cost reasons, typically mechanical or chemical etching and polishing processes are employed for reducing the thickness. As these processes exhibit intrinsic thickness variations of the processed substrates, other processes having pre-defined etch or polishing steps are employed to avoid such variations. For example, buried pn-junctions can be used as etch step. Furthermore, change of material properties or different material combinations can also be used either as etch stop or as layer which allows a separation of substrates. Such "separation layers" must withstand the processing conditions during integration of the devices.

Other approaches uses laser light to generate separation regions in a given distances from the substrate surface. Such processes, however, are very cost-intensive.

Another option for manufacturing semiconductor devices is the use of SOI-wafers which provides for a better dielectric insulation to the bulk substrate. Again, a comparably thin semiconductor layer is typically desired for integrating the devices to reduce parasitic capacitances and to insulate the devices from the bulk material. To produce a thin layer, for example 0.2 µm-10 µm, on a SOI-wafer, a thick semiconductor wafer can be bonded to the SOI-wafer. Before bonding, hydrogen ions are implanted into a given depth of the thick semiconductor wafer to generate a separation region. During bonding, or an additional annealing step, the bonded thick semiconductor wafer splits along the separation region so that a comparably thin layer remains attached to the SOI-wafer. This technique is known as "smart-cut" which is, however, very cost-intensive due to the hydrogen implantation.

On the other hand, thin seed-layers may be needed for some processes, for example for subsequent epitaxial growth. In some cases, semiconductor material is grown on a carrier of a different semiconductor material. After epitaxial growth, the grown layer needs to be removed from the carrier without causing damage to the epitaxial layer.

In view of the above, there is a need for improvement.

SUMMARY

According to an embodiment, a method for manufacturing a semiconductor substrate includes providing a semiconductor wafer having a first surface and a second surface opposite to the first surface; forming, when seen in a cross-section perpendicular to the first surface, cavities in the semiconductor wafer at a first distance from the first surface, the cavities being laterally spaced from each other by partition walls formed by semiconductor material of the wafer, wherein the cavities form a separation region; forming a semiconductor layer on the first surface of the semiconductor wafer; breaking at least some of the partition walls by applying mechanical impact to the partition walls to split the semiconductor wafer along the separation region.

According to an embodiment, a method for manufacturing a semiconductor substrate includes providing a seed-wafer having a first surface and a second surface opposite the first surface, wherein the seed-wafer includes semiconductor material exposed at the first surface of the seed-wafer; forming, when seen in a cross-section perpendicular to the first surface, cavities in the seed-wafer at a first distance from the first surface, the cavities being laterally spaced from each other by partition walls formed by the semiconductor material of the seed-wafer, wherein the cavities form a separation region; forming an epitaxial layer on the exposed semiconductor material of the seed-wafer, the epitaxial layer having a thickness which is larger than the first distance between the cavities and the first surface of the seed-wafer; and breaking at least some of the partition walls by applying mechanical impact to the partition walls to split the semiconductor wafer along the separation region.

According to an embodiment, a method for manufacturing a semiconductor substrate includes providing a seed-wafer having a first surface and a second surface opposite the first surface, wherein the seed-wafer includes a first semiconductor material exposed at the first surface of the seed-wafer; forming, when seen in a cross-section perpendicular to the first surface, cavities in the seed-wafer at a first distance from the first surface, the cavities being laterally spaced from each other by partition walls formed by the first semiconductor material of the seed-wafer and forming a separation region; depositing, at an elevated temperature, a second semiconductor material different to the first semiconductor material on the exposed first semiconductor material of the seed-wafer, the second semiconductor material having a thickness which is at least 10-times larger than the first distance between the cavities and the first surface of the seed-wafer; and cooling the seed-wafer with the second semiconductor material deposited on the first surface of the seed-wafer to cause mechanical stress acting on the partition walls due to different thermal shrinkage of the first semiconductor material and the second semiconductor material, wherein the mechanical stress results in breaking of at least some of the partition walls to split at least partially the seed-wafer along the separation region.

According to an embodiment, a method for manufacturing a semiconductor substrate includes providing a first wafer having a first surface and a second surface opposite the first surface; forming cavities interconnected with each other in the first wafer at a first distance from the first surface, wherein the cavities, when seen in a cross-section perpendicular to the first surface, are laterally spaced from each other by partition walls formed by material of the first wafer, and wherein the cavities form a separation region; forming a semiconductor layer on the first surface of the first wafer; filling the cavities with an aqueous solution; and breaking the partition walls by applying mechanical impact to the partition walls through the aqueous solution to split the first wafer along the separation region.

According to an embodiment, a method for manufacturing a semiconductor substrate having semiconductor devices integrated therein includes providing a seed-wafer having a first surface and a second surface opposite the first surface, wherein the seed-wafer includes a semiconductor material exposed at the first surface of the seed-wafer; forming cavities in the seed-wafer at a first distance from the first surface, wherein the cavities, when seen in a cross-section perpendicular to the first surface, are laterally spaced from each other by partition walls formed by the semiconductor material of the seed-wafer, and wherein the cavities form a separation region; depositing an epitaxial layer on the exposed semiconductor material of the seed-wafer at the first surface of the seed-wafer; at least partially integrating semiconductor devices in the epitaxial layer by forming doping regions in the epitaxial layer; and breaking the partition walls by applying mechanical impact to the partition walls to split the seed-wafer along the separation region.

According to an embodiment, a method for manufacturing a semiconductor substrate includes providing a first wafer having a first surface and a second surface opposite the first surface; forming cavities in the first wafer at a first distance from the first surface, wherein the cavities, when seen in a cross-section perpendicular to the first surface, are laterally spaced from each other by partition walls formed by the semiconductor material of the first wafer, and wherein the cavities form a separation region; bonding a second wafer on the first surface of the first wafer; breaking the partition walls by applying mechanical impact to the partition walls to split the first wafer along the separation region so that a residual wafer remains attached to the second wafer; and depositing an epitaxial layer on the residual wafer.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 5A to 5D illustrate a method for manufacturing a semiconductor substrate having semiconductor devices integrated therein according to an embodiment;

FIGS. 8A to 8C illustrate plane views of cavities of semiconductor substrates according to various embodiments.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims. The embodiments can be combined unless noted otherwise. The drawings are not drawn to scale.

The term "lateral" as used in this specification intends to describe an orientation parallel to a first main surface of a semiconductor substrate.

The term "vertical" as used in this specification intends to describe an orientation, which is arranged perpendicular to the first surface of the semiconductor substrate.

In this specification, a second surface of a semiconductor substrate is considered to be formed by the lower or back-side surface while the first surface is considered to be formed by the upper, front or main surface of the semiconductor substrate. The terms "above" and "below" as used in this specification therefore describe a relative location of a structural feature to another structural feature with consideration of this orientation.

With reference to FIGS. 1A to 1G a first embodiment is described. A semiconductor wafer 100 having a first surface 101 and a second surface 102 opposite to the first surface 101 is provided. In this embodiment, the wafer 100 is comprised of Si but could also be comprised of other semiconductor material such as SiC, SiGe, or sapphire.

Figure 1C:
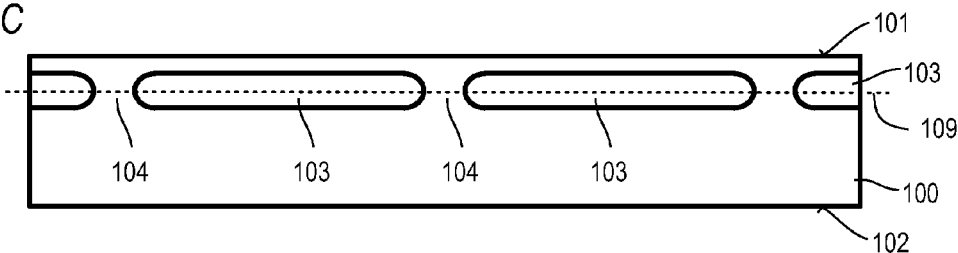
Figure 2:
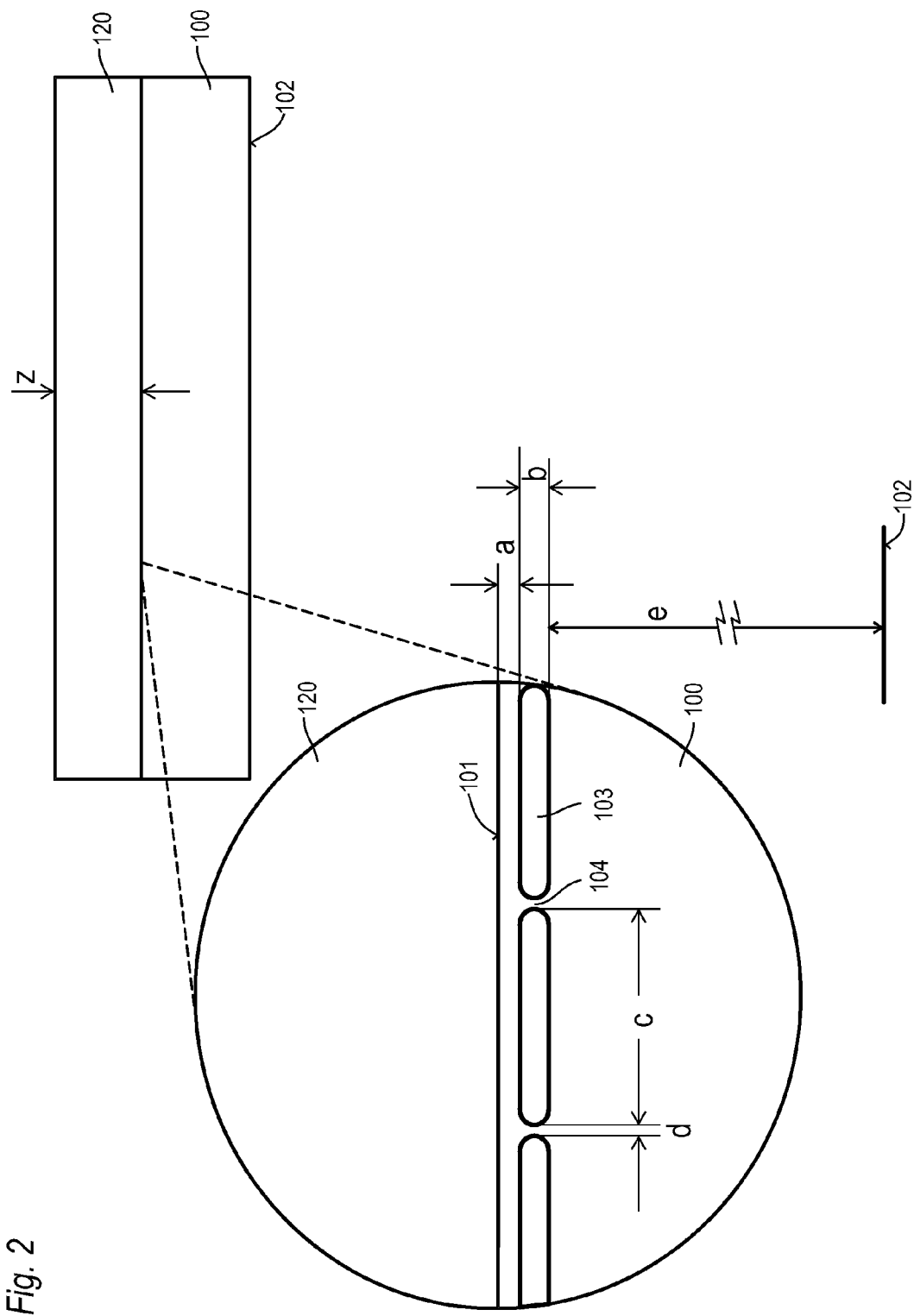
FIG. 2 illustrates an enlarged view of a semiconductor substrate having cavities formed therein.

In a further process, laterally extending cavities 103, with respect to the lateral direction parallel to the first surface 101, are formed, when seen in a cross-section perpendicular to the first surface 101, in the semiconductor wafer 100 at a first distance "a" from the first surface 101. The first distance "a" is indicated in FIG. 2. The cavities 103 are laterally spaced from each other by partition walls 104 formed by semiconductor material of the wafer 100 as seen in FIG. 1C. The cavities 103 form a separation region 109 indicated by a dotted line in FIG. 1C.

The cavities 103 can be formed, according to an embodiment, by forming a plurality of groups 112 of closely spaced trenches 108 in the first surface 101 of the wafer 100, wherein the trenches 108 extend at least to a depth from the first surface 101 corresponding to the first distance "a". Typically, the trenches 108 will be formed deeper than the sum of the distance "a" and the height "b" of the cavities 103. Height "b" of the cavities 103 is also indicated in FIG. 2.

The depth of the cavities 103 within wafer 100 can be adjusted, for example, by the depth of the trenches 108 and also the volume of the hollow trenches 108. Deeper cavities 103, i.e. cavities 103 having a comparably large first distance "d", can be formed for example by bottle-shaped trenches 108.

Figure 1A:
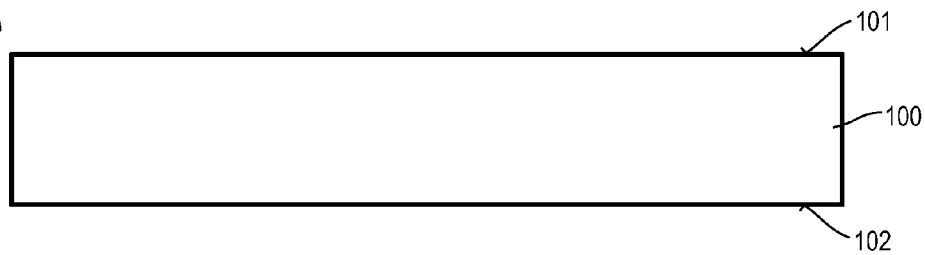
FIGS. 1A to 1G illustrate a method for manufacturing a semiconductor substrate having semiconductor devices integrated therein according to an embodiment.
Figure 1B:
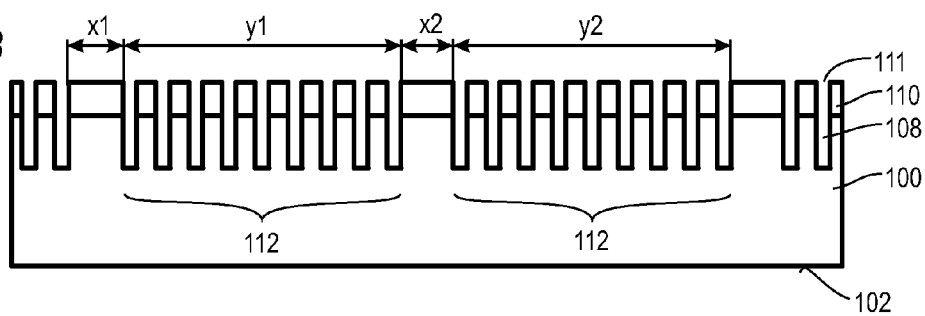

For forming the groups 112 of closely spaced trenches 108, a mask 110 having openings 111 defining the size and location of the trenches 108 to be formed can be formed on the first surface 101 of wafer 100 as seen in FIG. 1B. The trenches 108 are formed, for example, by anisotropic etching using the mask 110 as an etching mask. In a plan view onto the first surface 101, the openings 111 may have a circular or ellipsoid cross-section. Other cross-sections such as square-shaped or rectangular-shaped are also possible.

A subsequent tempering of the wafer 100 at an elevated temperature in a deoxidizing atmosphere causes surface migration of the semiconductor material of the wafer 100 until the trenches 108 of the respective groups 112 of closely spaced trenches 108 coalesce to respective cavities 103. This is indicated in FIG. 1C.

Referring back to FIG. 1B, the lateral distance x1, x2 between the groups 112 of closely spaced trenches 108 is larger than the pitch of the trenches 108 within a group 112 of closely spaced trenches 108 so that the trenches of adjacent groups 112 of closely spaced trenches 108 do not merge. In fact, between adjacent final cavities 103, each of which is formed by a respective group 112 of closely spaced trenches 108 which have coalesced or merged during the tempering, there are partition walls 104.

The process conditions during tempering can be adjusted according to specific needs. For illustration purposes, the temperature can be in a range from about 1000° C. to about 1150° C. In this temperature range, the Si-semiconductor material of the wafer 100 begins to "flow" and the trenches 108 start to become closed by the flowing material. On the other hand, the trenches 108 widen in the depth due to the flowing material so that closely spaced trenches 108 begin to merge. Whether a trench 108 transforms to a single cavity or adjacent trenches 108 merge to a common cavity depends on the lateral spacing, i.e. pitch, of the trenches 108. A cavity formed by a single trench may have a spherical shape while a cavity formed by a plurality of trenches 108 may have an elongated shape or even plane shape, when seen in a projection onto the first surface 101. For example, a rectangular array of closely spaced trenches 108 form a rectangular cavity (seen in projection onto the first surface 101) while a row of closely spaced trenches 108 forms an elongated cavity. Therefore, by selecting the arrangement of the trenches 108, virtually any cavity arrangement and shape can be formed.

The tempering can be carried out, according to an embodiment, in a deoxidizing atmosphere, for example in a hydrogen atmosphere at low pressure, for example at about 10 Torr (about $1.3 \cdot 10^3$ Pa). The duration of the tempering process can be varied and can be selected in view of the temperature. A typical tempering time at the desired tempering temperature is about 10 min.

Figure 3C:
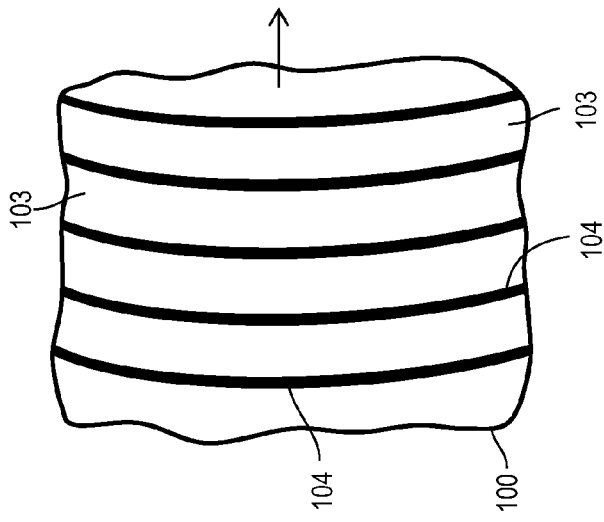
FIGS. 3A to 3C illustrate plan views of cavities of semiconductor substrates according to various embodiments.
Figure 3B:
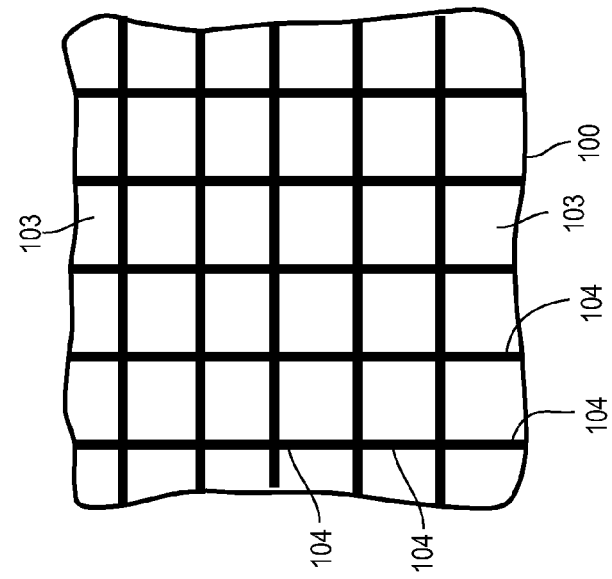
Figure 3A:
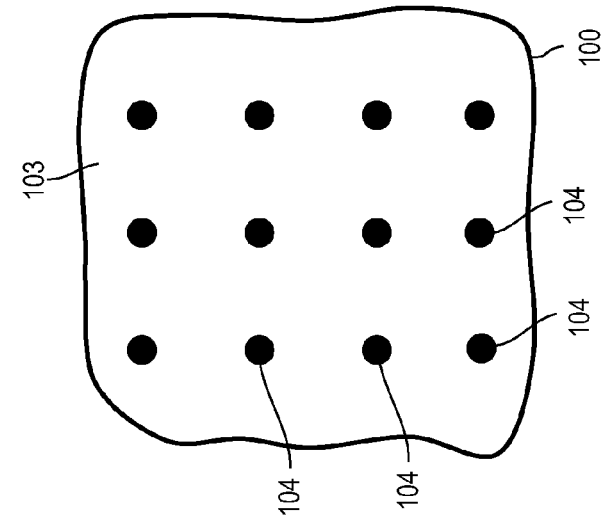

Suitable shapes of the formed cavities 103 are illustrated in FIGS. 3A to 3C which show projections onto the first surface 101. The cavity 103 can be a single large cavity 103, or a connected cavity, as shown in FIG. 3A. The cavity 103 is mechanically stabilised by separate partition walls 104 formed by pillar-shaped walls as shown in FIG. 3A. Alternatively, separate square or rectangular cavities 103 can be formed which are separated from each other by partition walls 104 as illustrated in FIG. 3B. The partition walls 104, and also the cavities 103, can also be formed as concentric rings around the geometric centre of the wafer 100 when seen in a projection onto the first surface 101. FIG. 3C illustrates a portion of the wafer showing segments of concentrically arranged cavities 103 and partition walls 104.

Hence, according to an embodiment, when seen in a projection onto the first surface 101 of the wafer 100, the cavities 103 are ring-shaped and are arranged in a substantially concentric manner.

The partition walls 104 can virtually have any suitable shape and size, for example hexagonal, quadratic or pillar-shaped (point-shaped). For the purpose of this embodiment, the area ratio between the cavities 103 and the partition walls 104, when seen in a projection onto the first surface 101, should be larger than 1, particularly larger than 10, and more particular larger than 20. The main function of the partition walls 104 is to provide sufficient mechanical stability so that the cavities 103 do not collapse during further processing. FIG. 2 illustrate geometrical parameters of the cavities 103 and the partition walls 104. Parameter "a" indicates the first distance between the cavities 103 and the first surface 101 while parameter "e" indicates a second distance between the cavities 103 and the second surface 102 of wafer 100. Parameter "b" defines the height of the cavities 103 while parameter "c" defines the lateral width of the cavities 103. Parameter "d" indicates the thickness of the partition walls 104 between adjacent cavities 103.

According to an embodiment, the ratio c:b is between about 10:1 to about 100:1. The cavities 103 have therefore a small height in comparison to their lateral extension. This ratio is beneficial for splitting the wafer 100 along the separation region 109 as described further below.

According to an embodiment, the ratio b:d is not higher than 5:1, particularly not higher than 3:1. The partition walls 103 shall not be too high as they should maintain their mechanical rigidity. This is again beneficial for a later separation along the separation region 109 defined by the cavities 103.

Referring back to FIG. 1B, the lateral distance x1, x2 between adjacent groups 112 of closely spaced trenches 108 for forming the cavities 103 can be equal or different. Furthermore, the lateral "extension" y1, y2 of the groups 112 of closely spaced trenches 108 can be equal or different according to specific need. The lateral distance x1, x2 determines the lateral thickness d of the final partition walls 104 while the lateral "extension" y1, y2 of the groups 112 of closely spaced trenches 108 determines the lateral width of the cavities 103. It should be noted here that due to the flow of the semiconductor material during the tempering process, the initial lateral distance x1, x2 does not exactly correspond to the final thickness of the partition walls 104 and the lateral "extension" y1, y2 of the groups 112 of closely spaced trenches 108 does not exactly correspond to the final lateral width of the cavities 103. The lateral distance x1, x2 is larger than the distance between adjacent trenches 108 within a group 112 of closely spaced trenches 108.

For illustration purposes, a single trench 108 within a group 112 of trenches 108 may have a depth between about 2 µm to about 5 µm, when seen in a cross-section perpendicular to the first surface 101, and a diameter between about 0.2 mm to about 1 µm, when seen in a plane view onto the first surface 101. The pitch within a group of adjacent trenches 108 of a group 112 of closely spaced trenches 108 may be between about 0.4 µm to about 2 µm. Selecting a lateral distance x1, x2 larger than, for example 2 µm, prevents the outer trenches 108 of adjacent groups 112 of closely spaced trenches 108 from merging. Suitable dimensions of the final cavities 103 and partition walls 104 are: parameter "a" between about 0.1 µm to about 1 µm; parameter "b" between about 1 µm to about 2 µm; parameter "c" between about 10 µm to about 100 µm; and parameter "d" between about 1 µm to about 5 µm.

The structure of the wafer 100 after formation of the cavities 103 is illustrated in FIG. 1C. As illustrated there, the cavities 103 are formed closer to the first surface 101 than to the second surface 102 so that only a comparably thin material layer is left between the cavities 103 and the first surface 101.

Figure 1D:
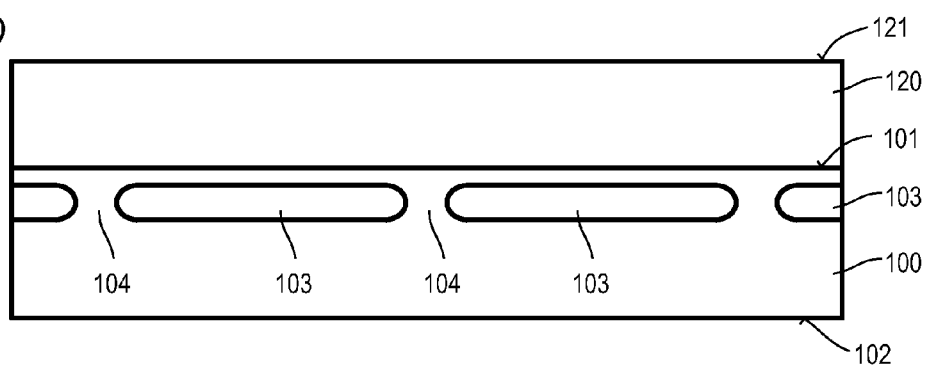

In a further process, as illustrated in FIG. 1D, a semiconductor layer 120 is formed on the first surface 101 of the semiconductor wafer 100. The semiconductor layer 120 can be formed, for example, by epitaxial deposition. In this case, the wafer 100 is a seed-wafer for the epitaxial layer 120 to be formed. For epitaxial growth, the semiconductor material of the wafer 100 is at least partially, typically completely, exposed at the first surface 101.

The crystallographic properties of the first surface 101 after formation of the cavities 103 are sufficient to function as a seed layer for an epitaxial growth. This is true for epitaxial growth of the same or of a different semiconductor material.

According to an embodiment, the wafer 100 and the epitaxial layer 120 are comprised of the same semiconductor material such as Si.

According to another embodiment, the wafer 100 is comprised of a first semiconductor material such as Si while the epitaxial layer 120 is comprised of a different semiconductor material such as GaN. An exposed Si-surface can be used for depositing GaN since both semiconductor materials have a similar lattice constant. In the present embodiment illustrated in FIGS. 1A to 1F, the epitaxial layer 120 is comprised of GaN which is deposited on the wafer 100 comprised of Si using suitably adapted processes.

Since the wafer 100 functions as seed-wafer, it is desirable to remove the wafer 100 from the formed epitaxial layer 120 in a later process. The separation region 109 formed by the cavities 103 will facilitate the separation. In addition to that, the cavities 103 and the partition walls 104 partially mechanically "decouple" the epitaxial layer 120 from the wafer 100.

GaN and Si have different coefficients of thermal expansion (Si: $2.6 \cdot 10^{-6}/°K$; GaN: $6 \cdot 10^{-6}/°K$). Epitaxial deposition occurs at elevated temperature, for example at a temperature higher than 800° C., for example at about 1000° C. During subsequent cooling, mechanical tension arises in the layer arrangement of the wafer 100 and the epitaxial layer 120 due to different thermal shrinkage of the different semiconductor materials. For example, assume a Si wafer 100 having a size of a 6 inch wafer with a GaN layer 120 deposited thereon at about 1000° C. After cooling to ambient temperature, the offset between the outer edges of the GaN layer 120 to the Si wafer 100 would be about 250 μm due to different shrinkage. However, since the GaN layer 120 and the wafer 100 are in 2-dimensional contact with each other, the different shrinkage will lead to large mechanical stress during cooling which would cause cracks in the GaN layer 102.

To avoid large mechanical stress during cooling and to facilitate separation of the Si wafer 100 from the GaN layer 120, the cavities 103 are provided close the first surface 101 of the wafer 100. The cavities 103 reduces the cross sectional area of the Si material in the level of the separation region 109. During cooling, the GaN layer 120 shrinks faster than the Si wafer 100. This is most pronounced at the edges of the GaN layer 120 and the wafer 100. The mechanical stress caused due to the different shrinkage is therefore concentrated in the partition walls 104 which, however, due to their comparably small height, cannot sufficiently flex to compensate the different shrinkage. As a result, the partition walls 104 break. This will typically start at the outer edge of the GaN layer 102 and the wafer 100 since the lateral offset between the two semiconductor materials will be most pronounced there. The breaking then progresses towards the centre of the wafer 100 upon further cooling. Once the layer arrangement of the GaN layer 102 and the wafer 100 is cooled to ambient temperature, most of all of the partition walls 104 are broken. Unbroken partition walls 104 can be cut either by etching or by applying a controlled mechanical impact such as ultrasound. Suitable embodiments employing ultrasonic sound, which can be combined with the above embodiments, are described further below. According to an embodiment, a subsequent wet-chemical etching or mechanical processes is carried out for finally splitting the wafer 100 along the separation region 109.

The shear stress caused by the different expansion or shrinkage of the GaN layer 120 and the Si wafer 100 and acting on the partition walls 104 is amplified approximately by a factor defined by an area ratio, when seen in a projection onto the first surface 101, between the area of the cavities 103 and the area of the partition walls 104. In many cases, this ratio can be approximated by c/d. Since the semiconductor material "above" the cavities 103 and the semiconductor material "below" the cavities 103 are connected with each other only through the partition walls 104, the mechanical stress will concentrate in the partition walls 104. The larger the cavities 103 relative to the partition walls 104, the larger the stress acting on the partition walls 104. For illustration purposes, assume a concentric arrangement of the cavities 103 and partition walls 104 as indicated in FIG. 3C. Assume furthermore, that the partition walls 104 have a lateral width "d" of about 2 μm while the lateral width "c" of the cavities 103 corresponding to the distance between adjacent partition walls 104 is about 50 μm. The shear stress acting on the partition walls 104 is then increased by a factor of about 25 in this case. In case of the point-wise arrangement of the partition walls 104 as illustrated in FIG. 3A and assuming that d is about 1 μm and c is about 10 μm, the factor would be about 100 or even higher since the area covered by the cavities 103 is nearly 100-times larger than the area covered by the partition walls 104.

To improve the thermally induced breaking of the partition walls 104, the mechanical properties of the semiconductor material of wafer 100 above the cavities 103 should be dominated by the mechanical characteristics of the deposited GaN layer 120. According to an embodiment, the thickness of the epitaxial GaN layer 120 is therefore at least 10-times larger, typically at least 50-times larger, than the first distance "a" between the cavities 103 and the first surface 101 of the wafer 100. Hence, the thickness of a Si layer formed by the material of the wafer 100 above the cavities 103 is significantly smaller than the thickness of the epitaxial layer 120.

On the other hand, the mechanical properties of the semiconductor material of the wafer 100 below the cavities 103 should be dominated by the mechanical characteristics of Si. According to an embodiment, the second distance "e" is therefore at least 50-times larger than the first distance "a".

As a consequence, at least some or all of the partition walls 104 are broken when a mechanical impact is applied to the partition walls 104 to split the wafer 100 along the separation region 109. In this embodiment, the mechanical impact is the result of the different thermal behaviour of the semiconductor material of the wafer 100 and the semiconductor material of the epitaxial layer 120. Additional external impact, for example by ultrasonic sound, can also be applied.

For illustration purposes, the thickness of the semiconductor material of the wafer 100 above the cavities 103, which thickness corresponds to the first distance "d", can be in a range of about 0.1 μm to about 1 μm. The total thickness of the wafer 100 may be about 500 μm while the thickness "z", as indicated in FIG. 2, of the epitaxial layer 120 can be about 50 μm to about 100 μm.

The above described approach allows the formation of comparably thick GaN layers on Si without the risk of cracks within the deposited GaN layer 120. This is beneficial from the process point of view for several reasons.

One reason is that a Si-wafer is comparably cheap relative to other suitable seed material for GaN such as Sapphire or SiC. Furthermore, current technology can only provide 6 inch sapphire or SiC wafers while Silicon technology is able to provide up to 12 inch wafer. Consequently, the deposited GaN layer would have the same size as the large 12 inch Si wafer and thus allows integration of more devices.

A further reason is that even thick GaN layers can be formed. The Si seed wafer 100 is only used as starting material which is conventionally removed before integrating devices into the GaN layer. Hence, a GaN layer having a thickness sufficient to provide mechanical stability for the subsequent processes is desired, i.e. the GaN layer 120 separated from the wafer 100 serves as wafer for further processing. Since the cavities 103 mechanically "decouple" the deposited GaN layer 120 from the seed wafer 100, thick GaN layer can be formed. Without the separation region 109 formed by the cavities 103, the thickness of the deposited GaN layer on Si would be restricted to about 6 μm to avoid cracks in the GaN layer. Hence, GaN layers 120 having a thickness larger than 6 μm, for example from about 50 μm to about 100 μm can be produced.

Another reason is that the cavities 103 facilitate separation of the GaN layer 120 from the seed wafer 100 by splitting the seed wafer 100 along the separation region 109. Hence, no demanding ion implantation, as needed by the smart cut technology, must be employed. Furthermore, separation nearly automatically occurs during cooling without any additional steps.

Hence, according to an embodiment, a method for manufacturing a semiconductor substrate is provided which includes providing a seed-wafer having a first surface and a second surface opposite the first surface, wherein the seed-wafer includes a first semiconductor material exposed at the first surface of the seed-wafer. Cavities are formed in the seed-wafer, when seen in a cross-section perpendicular to the first surface, at a first distance from the first surface, wherein the cavities are laterally spaced from each other by partition walls formed by the first semiconductor material of the seed-wafer. The cavities form a separation region. A further process include depositing, at an elevated temperature, a second semiconductor material different to the first semiconductor material on the exposed first semiconductor material of the seed-wafer with a thickness which is at least 10-times larger than the first distance between the cavities and the first surface of the seed-wafer. A further process includes cooling the seed-wafer with the second semiconductor material deposited on the first surface of the seed-wafer to cause mechanical stress acting on the partition walls due to different thermal shrinkage of the first semiconductor material and the second semiconductor material, wherein the mechanical stress results in breaking of at least some of the partition walls to split at least partially the seed-wafer along the separation region.

The shear strain caused by the different thermal deformation of the first and second semiconductor material is partially or completely "absorbed" by the partition walls which will break. The second semiconductor material can therefore be comparably thick without the risk that cracks occur in the second semiconductor material.

Figure 1E:
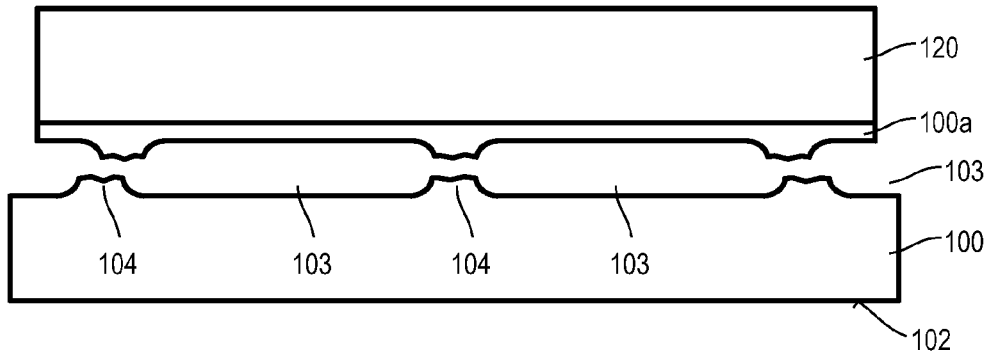

FIG. 1E illustrates the situation after cooling and breaking of the partition walls 104. The final different lateral extension of the epitaxial layer 120 and the wafer 100 is also illustrated.

According to another embodiment, a method for manufacturing a semiconductor substrate is provided which includes providing a seed-wafer having a first surface and a second surface opposite the first surface, wherein the seed-wafer is comprised of a semiconductor material exposed at the first surface of the seed-wafer. Cavities are formed in the seed-wafer, when seen in a cross-section perpendicular to the first surface, at a first distance from the first surface, wherein the cavities are laterally spaced from each other by partition walls formed by the semiconductor material of the seed-wafer. The cavities form a separation region. An epitaxial layer is formed on the exposed semiconductor material of the seed-wafer with a thickness which is larger than the first distance between the cavities and the first surface of the seed-wafer. At least some of the partition walls are broken by applying mechanical impact to the partition walls to split the semiconductor wafer along the separation region.

According to an embodiment and as shown in FIG. 1E, a residual wafer 100a remains attached to the epitaxial layer 120 after breaking of the partition walls 104. The residual wafer 100a is formed by the material of the wafer 100 which remains in contact with the epitaxial layer 120 and which is predominantly formed by the semiconductor material above the cavities 103.

Figure 1F:
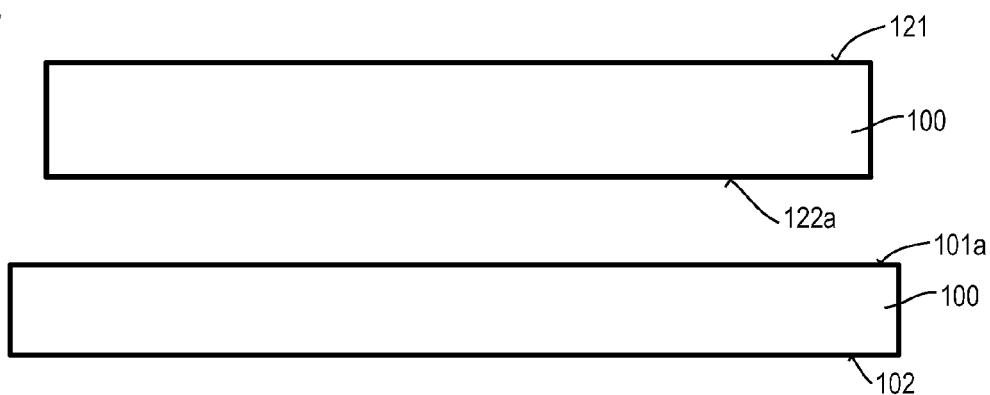

In a further process, the epitaxial layer 120 is processed at the side where the residual wafer 100a remains attached, for example by polishing, grinding or etching. The residual wafer 100a may only be polished to provide a smooth surface or may be completely removed as illustrated in FIG. 1F. As a result, the epitaxial layer 120 has a first surface 121, which was the originally upper and exposed surface of the epitaxial layer 120, and a processed second surface 122a.

Furthermore, the wafer 100 can also be polished at its side where the cavities 103 were formed to obtain a smooth processed first surface 101a. The wafer 100 can then be re-used as a seed-wafer, including formation of cavities as described above.

Figure 1G:
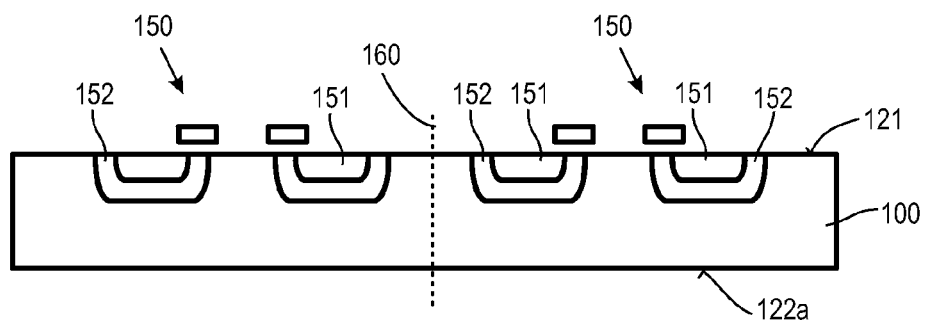

In a further process, as illustrated in FIG. 1G, semiconductor devices 150 are integrated in the epitaxial layer 120, in this case at the first surface 121, by forming at least one doping region 151, 152. For example, power GaN devices such as FETs, IGBTs, and diodes, to name a few, can be integrated either as lateral devices or as vertical devices.

In a further process, individual semiconductor devices 150 can be separated from each other along vertical cut lines 160 as indicated in FIG. 1G.

In the above described embodiment, the semiconductor devices 150 are integrated after splitting of the wafer 100 and optional removal of the residual wafer 100a. This is particular beneficial for cases when the epitaxial layer 120 is made of a semiconductor material different to the semiconductor material of wafer 100.

The above described approach can be applied to any combination of semiconductor material irrespectively, whether the wafer 100 or the epitaxial layer 120 has the higher or lower coefficient of thermal expansion. Mechanical tensions which develop between the different semiconductor materials, either during deposition, cooling, heating or due to other reasons, will be absorbed by the irreversible deformation and final break of the partition walls 104.

The above described embodiments made use of intrinsically occurring mechanical tensions caused by the thermal deformation of different semiconductor materials. In further embodiments, externally induced mechanical tensions are used for breaking the partition walls.

With reference to FIGS. 4A to 4D, a further embodiment is described next.

Figure 4A:
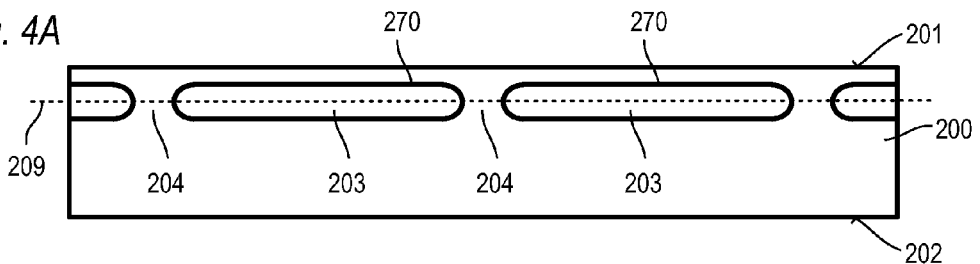
FIGS. 4A to 4D illustrate a method for manufacturing a semiconductor substrate having semiconductor devices integrated therein according to an embodiment.

A first wafer 200 having a first surface 201 and a second surface 202 opposite the first surface 201 is provided. The first wafer 200 is made in this embodiment of Si but can also be made of other semiconductor materials such as SiC, SiGe, sapphire, and GaN to name a few. Cavities 203 are formed as described previously herein. In this embodiment, the cavities 203 are interconnected with each other in the first wafer 200 and are arranged, similar to the above embodiments, at a first distance "a" from the first surface 201. The cavities 203, when seen in a cross-section perpendicular to the first surface 201, are laterally spaced from each other by partition walls 204 formed by material of the first wafer 200. Similar to the embodiments previously described herein, the cavities 203 form a separation region 209. Formation of the cavities 203 can be carried out as previously described herein. Therefore, the detailed description of the cavity formation process is omitted here. FIG. 4A shows the first wafer 200 having laterally extending cavities 203.

In a further process, a semiconductor layer 220 is formed on the first surface 201 of the first wafer 200. The semiconductor layer 220 can either be an epitaxial layer or a bonded layer. The thickness and the doping of the semiconductor layer 220 can be selected according to specific needs. In case of epitaxial deposition, the first wafer 200 serves as a seed-wafer.

Figure 4B:
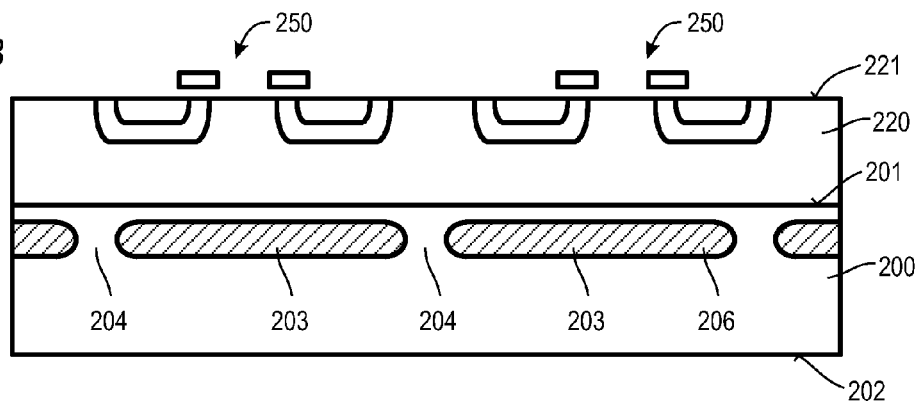

In a further process, the cavities 203 are filled with an aqueous solution 206 such as pure water as illustrated in FIG. 4B.

In a further process, the partition walls 204 are broken by applying mechanical impact to the partition walls 204 through the aqueous solution 206 to split the first wafer 200 along the separation region 209. The mechanical impact can be generated, for example, through expansion of the aqueous solution 206 within the cavities 203 or through ultrasonic sound supplied to the aqueous solution 206.

According to an embodiment, the aqueous solution 206 has a freezing point. In case of pure water the freezing point is 0° C. For breaking the partition walls 204 the aqueous solution 206 is cooled in the interconnected cavities 203 below the freezing point to cause expansion of the aqueous solution 206. Typically, the wafer 200 together with the semiconductor layer 220 is cooled below the freezing point. The aqueous solution 206 begins to freeze and expand. This expansion generates a large mechanical impact which finally leads to cracks and breaks within the partition walls 204 as the partition walls 204 are the weakest mechanical element due to their small cross-section area. The partition walls 204 are disrupted due to the expanding frozen aqueous solution 206.

According to an embodiment, a hydrophilic layer 270 is formed on internal surfaces of the cavities 203 prior to filling the cavities 203 with the aqueous solution 206. This is illustrated in FIG. 4A. The hydrophobic layer 270 facilitates filling of the cavities 203 with the aqueous solution 206 which would be difficult if the semiconductor material of the first wafer 200 is hydrophobic.

According to an embodiment, the hydrophilic layer 270 is formed by oxidising the internal surfaces of the cavities 203. This can be done at any time between formation of the cavities 203 and filling with the aqueous solution 206. The hydrophilic layer 270 causes large capillary forces acting on the aqueous solution 206 which suck the aqueous solution 206 into the cavities 203. Since the cavities 203 are interconnected with each other, all cavities 203 are filled.

To prevent gas bubbles, the first wafer 200 can be first subjected to a vacuum to remove gas from the cavities 203 followed by immersion of the first wafer 200 into the aqueous solution 206. It is beneficial to keep the vacuum conditions during filling.

Figure 4C:
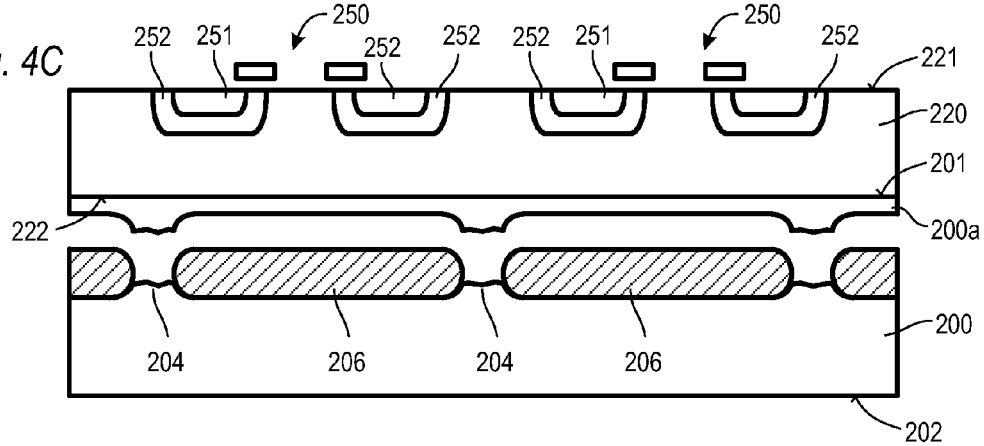

According to an embodiment, at least one semiconductor device 250, typically a plurality of semiconductor devices 250 is integrated into the semiconductor layer 220 before splitting the first wafer 200 by forming at least one doping region 251, 252. This is illustrated in FIG. 4C. The semiconductor layer 220 is in contact with the first wafer 200 during partial or complete integration of the semiconductor devices 250. The first wafer 200 functions as a carrier wafer for the semiconductor layer 220 if the semiconductor layer 220 is not mechanically stable by itself. Hence, the semiconductor layer 220 can be thinner than the first wafer 200.

The semiconductor layer 220 includes an exposed first surface 221 and a second surface 222 which is in contact with the first surface 201 of the first wafer 200. Integration of the semiconductor devices 250 occurs at least at the first surface 221 of the semiconductor layer 220.

Figure 4D:
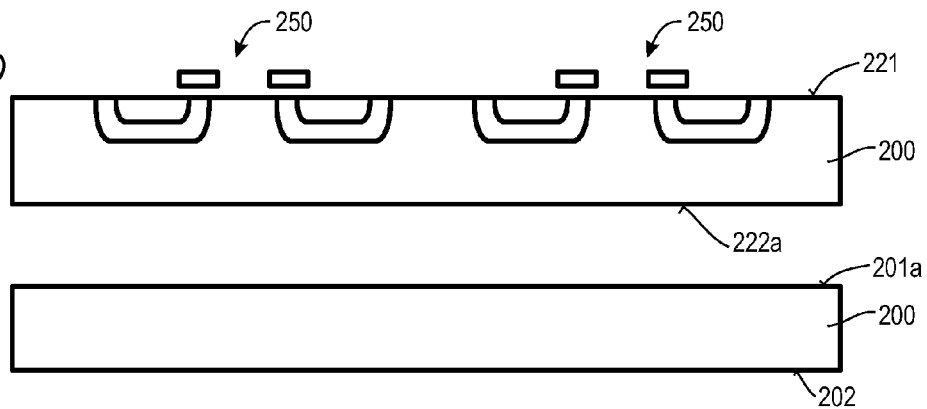

After partial or complete integration of the semiconductor devices 250, the first wafer 200 is split along the separation region 209 as described above and shown in FIG. 4C. Similar as previously described herein, a residual wafer 200a remains attached to the second surface 222 of the semiconductor layer 220. The residual wafer 200a can be finally removed or only polished. FIG. 4D shows the case of a completely removed residual wafer 200a. In this case the semiconductor layer 220 has a processed second surface 222a at which further structures of the semiconductor devices 250 can be integrated.

Similar as previously described herein, the first wafer 200 can be polished or grinded at its first surface 201 to flatten this surface after splitting to have a flat processed first surface 201 a. The first wafer 200 can then be re-used.

In view of the above, a method for manufacturing a semiconductor substrate having semiconductor devices integrated therein includes providing a seed-wafer 200 having a first surface 201 and a second surface 202 opposite the first surface 201. The seed-wafer 200 includes a semiconductor material exposed at the first surface 201 of the seed-wafer 200. Cavities 203 are formed in the seed-wafer 200 at a first distance from the first surface 201, wherein the cavities 203 when seen in a cross-section perpendicular to the first surface 201, are laterally spaced from each other by partition walls 204 formed by the semiconductor material of the seed-wafer 200. The cavities 203 form a separation region 209. An epitaxial layer 220 is deposited on the exposed semiconductor material 200 of the seed-wafer 200 at the first surface 201 of the seed-wafer. Semiconductor devices 250 are at least partially integrated in the epitaxial layer 220 by forming doping regions 251, 252 in the epitaxial layer 220. The partition walls 204 are broken by applying mechanical impact to the partition walls 204 to split the seed-wafer 200 along the separation region 209.

According to an embodiment, the cavities 203 are interconnected with each other and filled with an aqueous solution 206 having a freezing point. Breaking the partition walls 204 includes cooling the aqueous solution 206 in the cavities 203 below the freezing point to cause expansion of the aqueous solution 206 which will break the partition walls 204.

Different to the embodiment illustrated in FIGS. 1A to 1G, integration of the semiconductor devices 250 starts before splitting the first wafer or seed-wafer 200.

In a further embodiment, the partition walls 204 are subjected to mechanical stress by applying ultrasonic sound to the aqueous solution 206. Hence, instead of cooling, ultrasonic sound is coupled into the first wafer 200, typically from the second surface 202. According to an embodiment, the aqueous solution 206 in the cavities 203 is subjected to ultrasonic sound to cause cavitation of the aqueous solution 206. Cavitation may lead to gas bubbles which generate a pressure within the cavities 203. As a result, the cavities 203 burst, similar as in the case of the freezing aqueous solution 206 leading to broken partition walls 204. The first wafer 200 is thus split along the predefined separation region 209.

Cavitation causes extreme local effects such as flows having a velocity of up to 1000 km\h, pressures of up to 2000 bar, and temperatures of up to 4500° C. These extreme local effects cause mechanical failure of the partition walls 204 and hence delamination of the first wafer 200. To generate cavitation, the frequency and energy of the supplied ultrasonic sound can be suitably selected. Furthermore, ultrasound application can be combined with other liquids as well which undergo cavitation when subjected to ultrasound.

Application of ultrasound can be combined with any other separation approach described herein.

In an alternative embodiment, ultrasound is supplied without having filled the cavities 203 with the aqueous solution 206. The ultrasonic sound can be supplied, for example, from the second surface 202 of the first wafer 200. Due to the restricted cross-sectional area of the partition walls 204, the ultrasound is concentrated in the partition walls 204 in the level of the separation region 209 and hence the ultrasonic sound energy is also focussed into the partition walls 204. As a result, the partition walls 204 will break. The energy increase in the partition walls 204 is approximately equal to the area ratio between the cavities 203 and the partition walls 204 as described previously herein, and is typically in the range between 10 and 100.

With reference to FIGS. 5A to 5D a further embodiment is described next. Similar as with the embodiment of FIGS. 4A to 4D, a seed-wafer 200 having a first surface 201 and a second surface 202 opposite to the first surface 201 is provided, wherein the seed-wafer 200 includes a semiconductor material exposed at the first surface 201 of the seed-wafer. Cavities 203 are formed in the seed-wafer 200 at a first distance from the first surface 201. The cavities 203, when seen in a cross-section perpendicular to the first surface 201, are laterally spaced from each other by partition walls 204 formed by the semiconductor material of the seed-wafer 200. The cavities 203 form a separation region 209. In a further process, an epitaxial layer 220 is deposited on the exposed semiconductor material 200 of the seed-wafer 200 at the first surface 201 of the seed-wafer 200. In a further process, semiconductor devices 250 are at least partially integrated in the epitaxial layer 220 by forming doping regions 251, 252 in the epitaxial layer 220. The resulting structure is illustrated in FIG. 5A which substantially corresponds to the structure illustrated in FIG. 4B, with the exception that the cavities 203 are not filled with an aqueous solution.

After partial or complete integration of the semiconductor devices 250, vertical separation trenches 261 extending from the first surface 221 of the epitaxial layer 220 at least as far as to the cavities 203 are formed between the semiconductor devices 250. The separation trenches 261 serve as vertical cut regions for individualizing the semiconductor devices 250.

The separation trenches 261 can be formed, for example, by plasma etching or laser cutting. The depth of the separation trenches 261 should be at least as far as the cavities 203 and is typically deeper than the cavities 203. The separation trenches 261 are formed from the first surface 221 of the epitaxial layer 220 to ensure that the epitaxial layer 220, which is the layer used for integrating the semiconductor devices 250, is cleanly cut. The structure after formation of the separation trenches 261 is illustrated in FIG. 5B. The semiconductor devices 250 are now individualized and form respective single chips which are still in contact with each other through the seed-wafer 200.

The individualized chips, which are still connected with each other, can be grabbed by suitable tools such as pick-and-place tools 280 adapted to handle semiconductor chips. Either the remaining contact to the seed-wafer 200 will break due to this mechanical handling or ultrasonic sound can be additionally supplied, for example through the suitably adapted pick-and-place tool 280. Alternatively, a separate ultrasonic transmitter 240 can be provided which, for example, supplies ultrasonic sound from the second surface 202 of the seed-wafer 200. In either case, the partition walls 204 experience mechanical impact which causes disruption of the partition walls 204. Hence, the partition walls 204 are broken by applying mechanical impact to the partition walls 204 to split the seed-wafer 200 along the separation region 209. This is illustrated in FIG. 5C with a first chip already transferred to another place, for example placed on a lead frame.

With reference to FIGS. 6A to 6F, a further embodiment is described next. A first wafer 300 having a first surface 301 and a second surface 302 opposite to the first surface 301 is provided. The first wafer 300 is comprised of Si but can also be comprised of other semiconductor material. Cavities 303 are formed in the first wafer 300 at a first distance from the first surface 301. The cavities 303, when seen in a cross-section perpendicular to the first surface 301, are laterally spaced from each other by partition walls 304 formed by the semiconductor material of the first wafer 300. The cavities 303 form a separation region 309. The resulting structure is substantially the same as after the processes indicated in FIGS. 1A to 1C so that reference is made to the corresponding description above for further details.

Figure 6A:
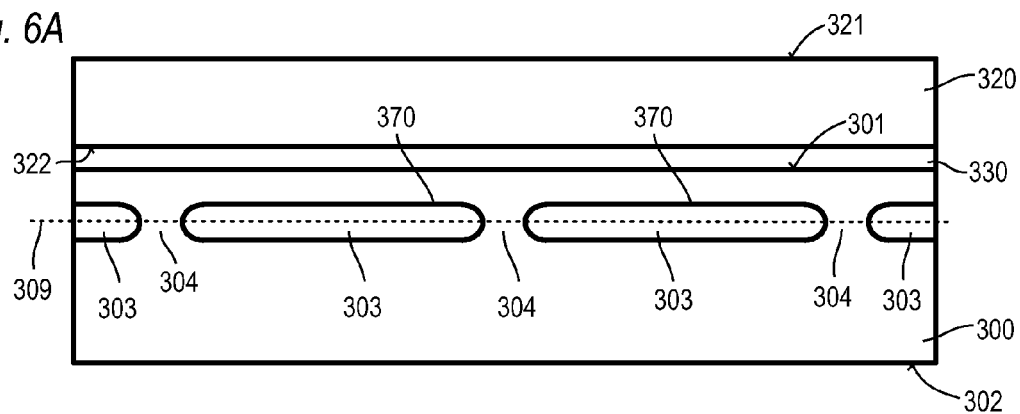
FIGS. 6A to 6F illustrate a method for manufacturing a semiconductor substrate having semiconductor devices integrated therein according to an embodiment.

In a further process, a second wafer 320 is bonded on the first surface 301 of the first wafer 300. The second wafer 320 is comprised of Si and can include a bonding layer 330 in contact with a second surface 322 of the second wafer 320. The second wafer 320 also includes a first surface 321. The bonding layer 330 can also be formed on the first surface 301 of the first wafer 300. Alternatively, bonding can be carried out without any bonding layer. Typically, the bonding layer 330 is an insulating layer such as a silicon oxide layer. The structure situation after bonding the second wafer 320 onto the first wafer 300 is illustrated in FIG. 6A.

Figure 6B:
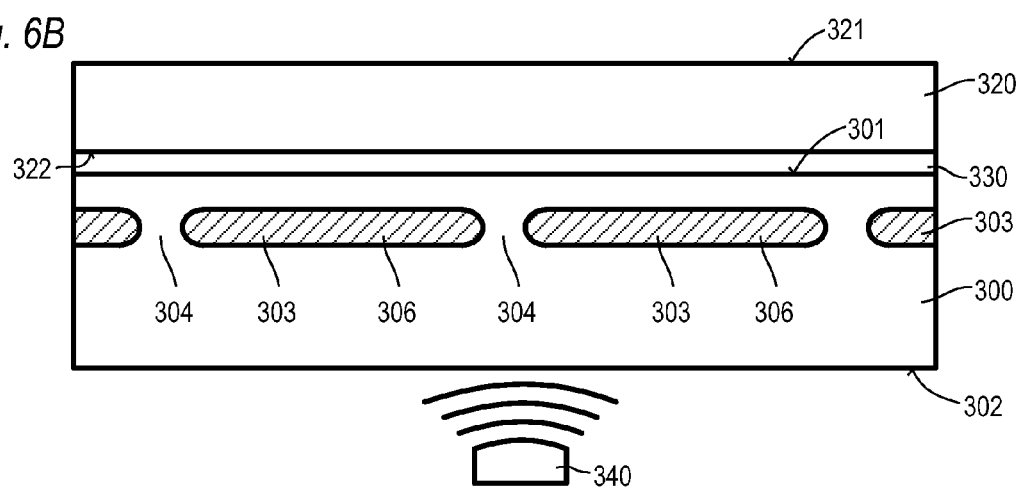
Figure 6C:
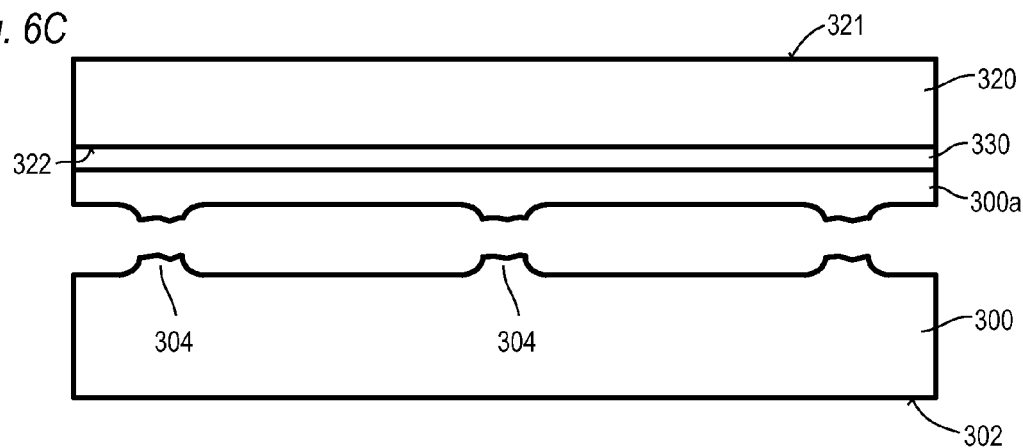

In a further process, the partition walls 304 are disrupted by applying mechanical impact to the partition walls 304 to split the first wafer 300 along the separation region 309. A residual wafer 300a remains attached to the second wafer 320, wherein the residual wafer 300a is formed by material of the first wafer 300 above the cavities 303, i.e. between the cavities 303 and the first surface 301 of the first wafer 300. The resulting structure is illustrated in FIG. 6C.

According to an embodiment, splitting the first wafer 300 is carried out according to any of the separation methods previously described herein. For example, the cavities 303 are formed such that they are interconnected with each other. An aqueous solution 306 having a freezing point is then filled into the cavities 303. Subsequent cooling of the aqueous solution 306 in the cavities 303 below the freezing point causes the partition walls 304 to break due to the expansion of the aqueous solution 306 within the cavities 303. To facilitate filling the cavities 303 with the aqueous solution 306, a hydrophilic layer 370, such as an oxide layer, can be formed on internal surfaces of the cavities 303 prior to filling the cavities 303 with the aqueous solution 306.

Alternatively, the aqueous solution 306 in the interconnected cavities 303 is subjected to ultrasonic sound to cause cavitation of the aqueous solution 306 as previously described herein. This is illustrated in FIG. 6B using a separate ultrasonic transmitter 340.

Figure 6D:
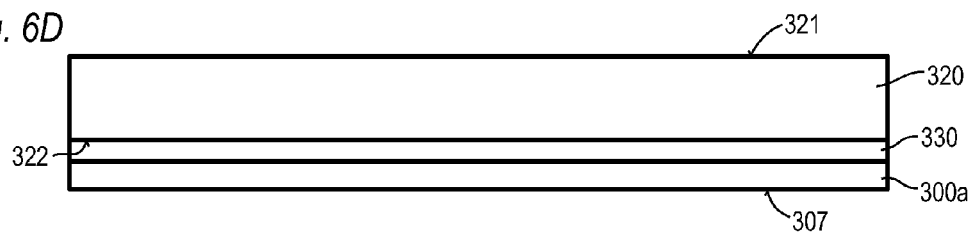

In a further process, as illustrated in FIG. 6D, the residual wafer 300a is polished to have a flat processed surface 307. Any suitable method can be used for processing the residual wafer 300a.

Figure 6E:
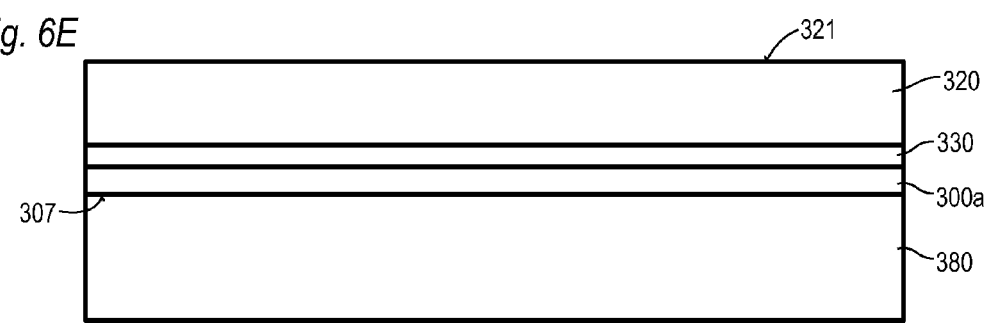

The residual wafer 300a, which is mechanically supported by the second wafer 320, is then used as a seed-layer for a subsequent epitaxial deposition as illustrated in FIG. 6E which shows the second wafer 320 with the residual wafer 300a bonded thereto upside down.

An epitaxial layer 380 is grown on the residual wafer 300a as shown in FIG. 6E. The epitaxial layer 380 has a first surface 321 and serves as active layer for integrating semiconductor devices. The buried bonding layer 330 serves as a buried insulation layer so that, using the above processes, a SOI-wafer having a use-layer (epitaxial layer 380) with a desired thickness and background doping is manufactured. The SOI-wafer is formed by the epitaxial layer 380, residual wafer 300a, insulating bonding layer 330 and second wafer 320.

Figure 6F:
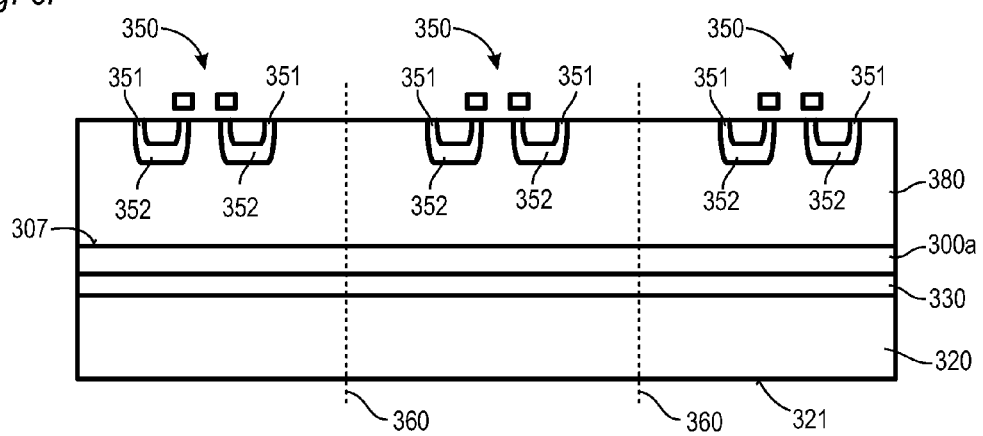

In a further process, as illustrated in FIG. 6F, semiconductor devices 350 are at least partially integrated in the epitaxial layer 380 by forming doping regions 351, 352 in the epitaxial layer 380. After partial or complete integration of the semiconductor devices 350, the semiconductor devices 350 are individualized by cutting the SOI-wafer along cut lines 360 indicated by dashed lines in FIG. 6F.

Figure 7:
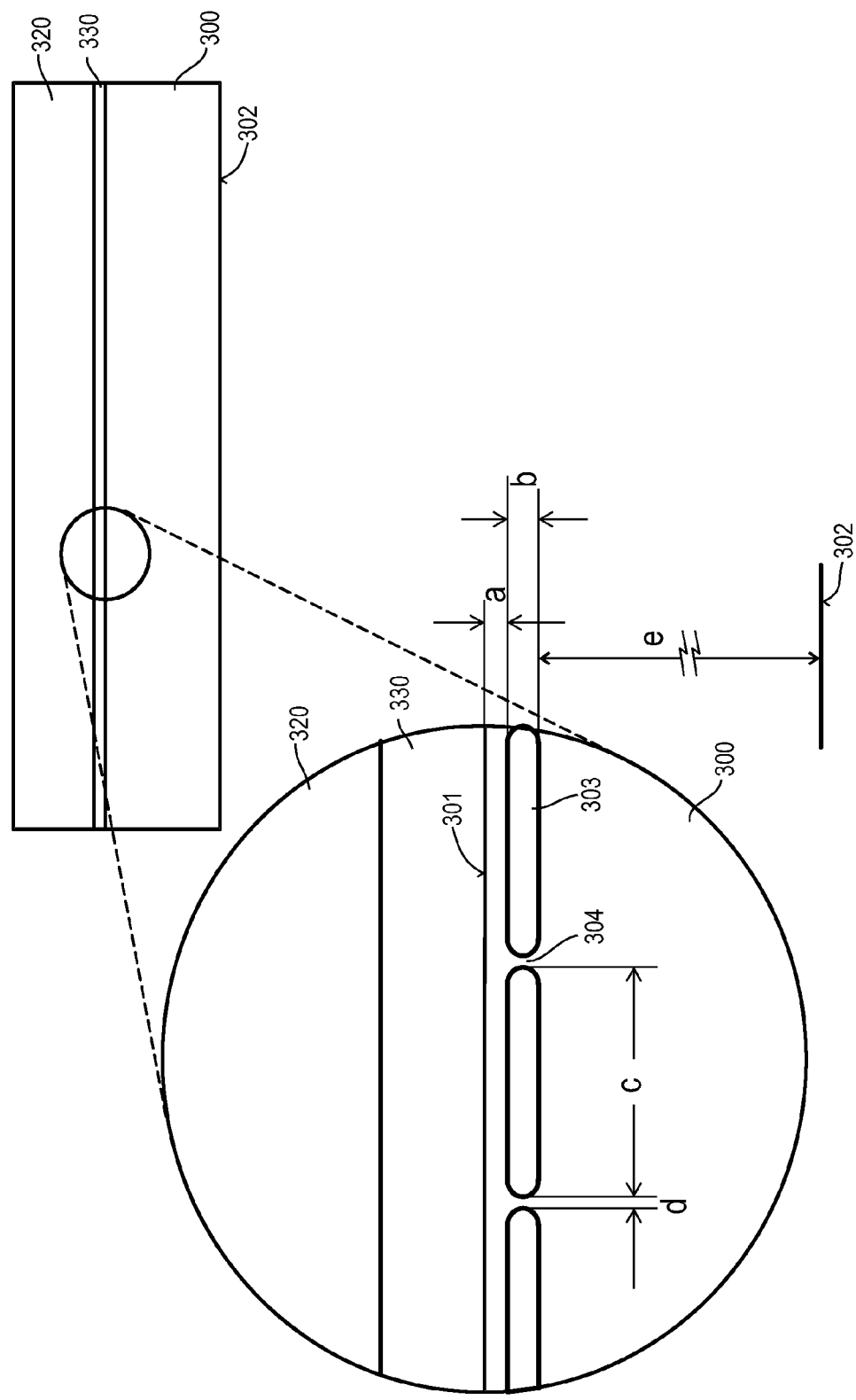
FIG. 7 illustrates an enlarged view of a semiconductor substrate having cavities formed therein.

The geometrical relations of the cavities 303 and partition walls 304 can be the same in this embodiment as in the embodiment illustrated in FIGS. 1A to 1G. FIG. 7 shows the geometrical relations using the same parameters as in FIG. 2.

FIGS. 8A to 8C show embodiments of interconnected cavities 300 which can be used in any of the above embodiments and specifically in those embodiments which uses the aqueous solution. FIG. 8A basically corresponds to FIG. 3A since there is only one large cavity 303. In FIGS. 8B and 8C, the adjacent cavities 303 are interconnected with each other by interconnections 305 which are basically formed by openings in the partition walls 304. The interconnections 305 are formed such that additional trenches 108 are provided between adjacent groups 112 of closely spaced trenches 108. For details, reference is made to the description of the processes illustrated in FIGS. 1A to 1C. The interconnection 305 can be arranged at any location as long as they ensure that all, or at least most of the cavities 303 can be reliably filled with the aqueous solution 306.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor substrate, comprising:
   providing a semiconductor wafer having a first surface and a second surface opposite the first surface;
   forming, when seen in a cross-section perpendicular to the first surface, cavities in the semiconductor wafer at a first distance from the first surface, the cavities being laterally spaced from each other by partition walls formed by semiconductor material of the wafer, the cavities forming a separation region;
   forming a semiconductor layer on the first surface of the semiconductor wafer; and
   breaking at least some of the partition walls by applying mechanical impact to the partition walls to split the semiconductor wafer along the separation region,
   wherein forming the cavities comprises:
      forming a plurality of groups of closely spaced trenches in the first surface of the semiconductor wafer, the trenches extending at least to a depth from the first surface corresponding to the first distance; and
      tempering the semiconductor wafer at an elevated temperature in a deoxidising atmosphere to cause surface migration of the semiconductor material of the semiconductor wafer until the trenches of the respective groups of closely spaced trenches coalesce to respective cavities.

2. A method according to claim 1, wherein a residual wafer remains attached to the semiconductor layer after breaking of the partition walls, the method further comprising:
   processing the semiconductor layer at a side where the residual wafer remains attached, wherein the processing comprises at least one of polishing, grinding and etching.

3. A method according to claim 1, wherein the cavities have a height b and a lateral width c, wherein the ratio c:b is between about 10:1 and about 100:1.

4. A method according to claim 1, wherein applying mechanical impact to the partition walls comprises at least one of:
   subjecting the partition walls to ultrasonic sound;
   filing the cavities with an aqueous solution having a freezing point, and cooling the aqueous solution below the freezing point to cause expansion of the aqueous solution within the cavities; and
   subjecting the partition walls to mechanical stress caused by thermal deformation of the wafer and the semiconductor material layer.

5. A method according to claim 1, wherein the elevated temperature is between about 1000° C. and about 1150° C.

6. A method for manufacturing a semiconductor substrate, comprising:
   providing a seed-wafer having a first surface and a second surface opposite the first surface, the seed-wafer comprising semiconductor material exposed at the first surface of the seed-wafer;
   forming, when seen in a cross-section perpendicular to the first surface, cavities in the seed-wafer at a first distance from the first surface, the cavities being laterally spaced from each other by partition walls formed by the semiconductor material of the seed-wafer, the cavities forming a separation region;
   forming an epitaxial layer on the exposed semiconductor material of the seed-wafer, the epitaxial layer having a thickness which is larger than the first distance between the cavities and the first surface of the seed-wafer; and
   breaking at least some of the partition walls by applying mechanical impact to the partition walls to split the semiconductor wafer along the separation region,
   wherein forming the cavities comprises:
      forming a plurality of groups of closely spaced trenches in the first surface of the seed-wafer, the trenches extending at least to a depth from the first surface corresponding to the first distance; and tempering the seed-wafer at an elevated temperature in a deoxidising atmosphere to cause surface migration of the semiconductor material of the seed-wafer until the trenches of the respective groups of closely spaced trenches coalesce to respective cavities.

7. A method according to claim 6, wherein the thickness of the epitaxial layer is at least 10-times larger than the first distance between the cavities and the first surface of the seed-wafer.

8. A method according to claim 6, wherein the cavities are spaced from the second surface of the seed-wafer by a second distance which is at least 50-times larger than the first distance.

9. A method according to claim 6, wherein the cavities have a height b and a lateral width c, wherein the ratio c:b is between about 10:1 and about 100:1.

10. A method according to claim 6, wherein a residual wafer remains attached to the epitaxial layer after breaking of the partition walls, the method further comprising one of:
removing the residual wafer from the epitaxial layer; and
polishing the residual wafer.

11. A method for manufacturing a semiconductor substrate, comprising:
providing a first wafer having a first surface and a second surface opposite the first surface;
forming cavities interconnected with each other in the first wafer at a first distance from the first surface, wherein the cavities, when seen in a cross-section perpendicular to the first surface, are laterally spaced from each other by partition walls formed by material of the first wafer, the cavities forming a separation region;
forming a semiconductor layer on the first surface of the first wafer;
filling the cavities with an aqueous solution; and
breaking the partition walls by applying mechanical impact to the partition walls through the aqueous solution to split the first wafer along the separation region,
wherein forming the cavities comprises:
forming a plurality of groups of closely spaced trenches in the first surface of the first wafer, the trenches extending at least to a depth from the first surface corresponding to the first distance; and
tempering the first wafer at an elevated temperature in a deoxidising atmosphere to cause surface migration of the semiconductor material of the first wafer until the trenches of the respective groups of closely spaced trenches coalesce to respective cavities.

12. A method according to claim 11, wherein the aqueous solution has a freezing point, and wherein breaking the partition walls comprises cooling the aqueous solution in the interconnected cavities below the freezing point to cause expansion of the aqueous solution.

13. A method according to claim 11, further comprising:
forming a hydrophilic layer on internal surfaces of the cavities prior to filling the cavities with the aqueous solution.

14. A method according to claim 13, wherein forming the hydrophilic layer comprises oxidising the internal surfaces of the cavities.

15. A method according to claim 11, wherein breaking the partition walls comprises subjecting the aqueous solution in the cavities to ultrasonic sound to cause cavitation of the aqueous solution.

16. A method for manufacturing a semiconductor substrate having semiconductor devices integrated therein, comprising:
providing a seed-wafer having a first surface and a second surface opposite the first surface, the seed-wafer comprising a semiconductor material exposed at the first surface of the seed-wafer;
forming cavities in the seed-wafer at a first distance from the first surface, wherein the cavities, when seen in a cross-section perpendicular to the first surface, are laterally spaced from each other by partition walls formed by the semiconductor material of the seed-wafer, the cavities forming a separation region;
depositing an epitaxial layer on the exposed semiconductor material of the seed-wafer at the first surface of the seed-wafer;
at least partially integrating semiconductor devices in the epitaxial layer by forming doping regions in the epitaxial layer; and
breaking the partition walls by applying mechanical impact to the partition walls to split the seed-wafer along the separation region,
wherein forming the cavities comprises:
forming a plurality of groups of closely spaced trenches in the first surface of the seed-wafer, the trenches extending at least to a depth from the first surface corresponding to the first distance; and
tempering the seed-wafer at an elevated temperature in a deoxidising atmosphere to cause surface migration of the semiconductor material of the seed-wafer until the trenches of the respective groups of closely spaced trenches coalesce to respective cavities.

17. A method according to claim 16, wherein the cavities are interconnected with each other, the method further comprising:
filling the interconnected cavities with an aqueous solution having a freezing point; and
breaking the partition walls by cooling the aqueous solution in the cavities below the freezing point to cause expansion of the aqueous solution.

18. A method according to claim 17, further comprising:
forming a hydrophilic layer on internal surfaces of the cavities prior to filling the cavities with the aqueous solution.

19. A method according to claim 16, wherein the cavities are interconnected with each other, the method further comprising:
filling the interconnected cavities with an aqueous solution; and
breaking the partition walls by subjecting the aqueous solution in the cavities to ultrasonic sound to cause cavitation of the aqueous solution.

20. A method according to claim 16, wherein breaking the partition walls comprises subjecting the partition walls to ultrasonic sound.

21. A method according to claim 16, wherein a residual wafer remains attached to the epitaxial layer after breaking of the partition walls, the method further comprising:
removing the residual wafer from the epitaxial layer.

22. A method according to claim 16, further comprising:
forming vertical separation trenches extending from a first surface of the epitaxial layer at least to the cavities between the semiconductor devices.

* * * * *